United States Patent
Li et al.

(10) Patent No.: US 10,115,682 B2
(45) Date of Patent: Oct. 30, 2018

(54) ERASABLE PROGRAMMABLE NON-VOLATILE MEMORY

(71) Applicant: eMemory Technology Inc., Hsin-Chu (TW)

(72) Inventors: Chun-Hsiao Li, Zhubei (TW); Wei-Ren Chen, Pingtung (TW); Hsueh-Wei Chen, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/481,889

(22) Filed: Apr. 7, 2017

(65) Prior Publication Data

US 2017/0301682 A1    Oct. 19, 2017

Related U.S. Application Data

(60) Provisional application No. 62/322,237, filed on Apr. 13, 2016.

(51) Int. Cl.
*H01L 27/108* (2006.01)
*H01L 23/00* (2006.01)
(Continued)

(52) U.S. Cl.
CPC ............ *H01L 23/573* (2013.01); *G06F 7/588* (2013.01); *G11C 16/0441* (2013.01);
(Continued)

(58) Field of Classification Search
CPC . H01L 23/573; H01L 28/00; H01L 27/11507; H01L 29/7841; H01L 27/11558;
(Continued)

(56) References Cited

U.S. PATENT DOCUMENTS 8,941,167 B2    1/2015    Chen et al.
9,601,501 B2    3/2017    Tsao et al.
(Continued)

FOREIGN PATENT DOCUMENTS

JP    2003332475    11/2003
JP    2012238852    12/2012
JP    2016018992    2/2016

OTHER PUBLICATIONS

Taiwan Intellectual Property Office, "Office Action", dated Jan. 23, 2018.
Japan Patent Office, "Office Action", dated Jun. 12, 2018.

*Primary Examiner* — Su C Kim
(74) *Attorney, Agent, or Firm* — WPAT, PC (57) ABSTRACT

An erasable programmable non-volatile memory includes a first transistor, a second transistor, an erase gate region and a metal layer. The first transistor includes a select gate, a first doped region and a second doped region. The select gate is connected with a word line. The first doped region is connected with a source line. The second transistor includes the second doped region, a third doped region and a floating gate. The third doped region is connected with a bit line. The erase gate region is connected with an erase line. The floating gate is extended over the erase gate region and located near the erase gate region. The metal layer is disposed over the floating gate and connected with the bit line.

11 Claims, 7 Drawing Sheets

(51) Int. Cl.

| | | |
|---|---|---|
| H01L 23/522 | (2006.01) | |
| H01L 27/088 | (2006.01) | |
| H01L 29/06 | (2006.01) | |
| G11C 16/14 | (2006.01) | |
| H01L 27/11507 | (2017.01) | |
| H01L 27/11529 | (2017.01) | |
| H01L 29/423 | (2006.01) | |
| G06F 7/58 | (2006.01) | |
| G11C 17/16 | (2006.01) | |
| G11C 17/18 | (2006.01) | |
| G11C 16/04 | (2006.01) | |
| H01L 27/11558 | (2017.01) | |
| H01L 49/02 | (2006.01) | |
| H01L 29/78 | (2006.01) | |

(52) U.S. Cl.
CPC .............. *G11C 16/14* (2013.01); *G11C 17/16* (2013.01); *G11C 17/18* (2013.01); *H01L 23/5226* (2013.01); *H01L 27/0883* (2013.01); *H01L 27/11507* (2013.01); *H01L 27/11529* (2013.01); *H01L 27/11558* (2013.01); *H01L 28/00* (2013.01); *H01L 29/0653* (2013.01); *H01L 29/42328* (2013.01); *H01L 29/42344* (2013.01); *H01L 29/42352* (2013.01); *H01L 29/7841* (2013.01); *G11C 2216/10* (2013.01); *H01L 29/7831* (2013.01); *H01L 29/7833* (2013.01)

(58) Field of Classification Search
CPC ........... H01L 29/0653; H01L 27/11529; H01L 29/42352; H01L 29/42344; H01L 27/0883; H01L 23/5226; H01L 29/42328; H01L 29/7831; H01L 29/7833; H01L 27/228; H01L 27/2436; H01L 27/10852; H01L 27/10855; G11C 16/0441; G11C 17/18; G11C 17/16; G11C 16/14; G11C 2216/10; G06F 7/588
See application file for complete search history.

(56) References Cited

U.S. PATENT DOCUMENTS

| | | | | |
|---|---|---|---|---|
| 2003/0235082 | A1* | 12/2003 | Hsu | .............. H01L 27/115 365/185.29 |
| 2008/0006868 | A1* | 1/2008 | Hsu | .............. H01L 27/115 257/314 |
| 2010/0084700 | A1 | 4/2010 | Ko | |
| 2012/0275213 | A1* | 11/2012 | Takemura | ............. G11C 11/404 365/149 |
| 2015/0054053 | A1 | 2/2015 | Park et al. | |

* cited by examiner

| | PW | SL | BL | EL | WL | Mode |
|---|---|---|---|---|---|---|
| PGM | 0V | 0V | VPP | VPP | Von | CHE |
| ERS | 0V | 0V | 0V | VEE | Voff | FN |
| Read | 0V | 0V | Vread | 0V | Von | |

ERASABLE PROGRAMMABLE NON-VOLATILE MEMORY

This application claims the benefit of U.S. provisional application Ser. No. 62/322,237, filed Apr. 13, 2016, the disclosure of which is incorporated by reference herein in its entirety.

FIELD OF THE INVENTION

The present invention relates to a non-volatile memory, and more particularly to an erasable programmable non-volatile memory.

BACKGROUND OF THE INVENTION

Figures 1A, 1B, 1C, 1D:
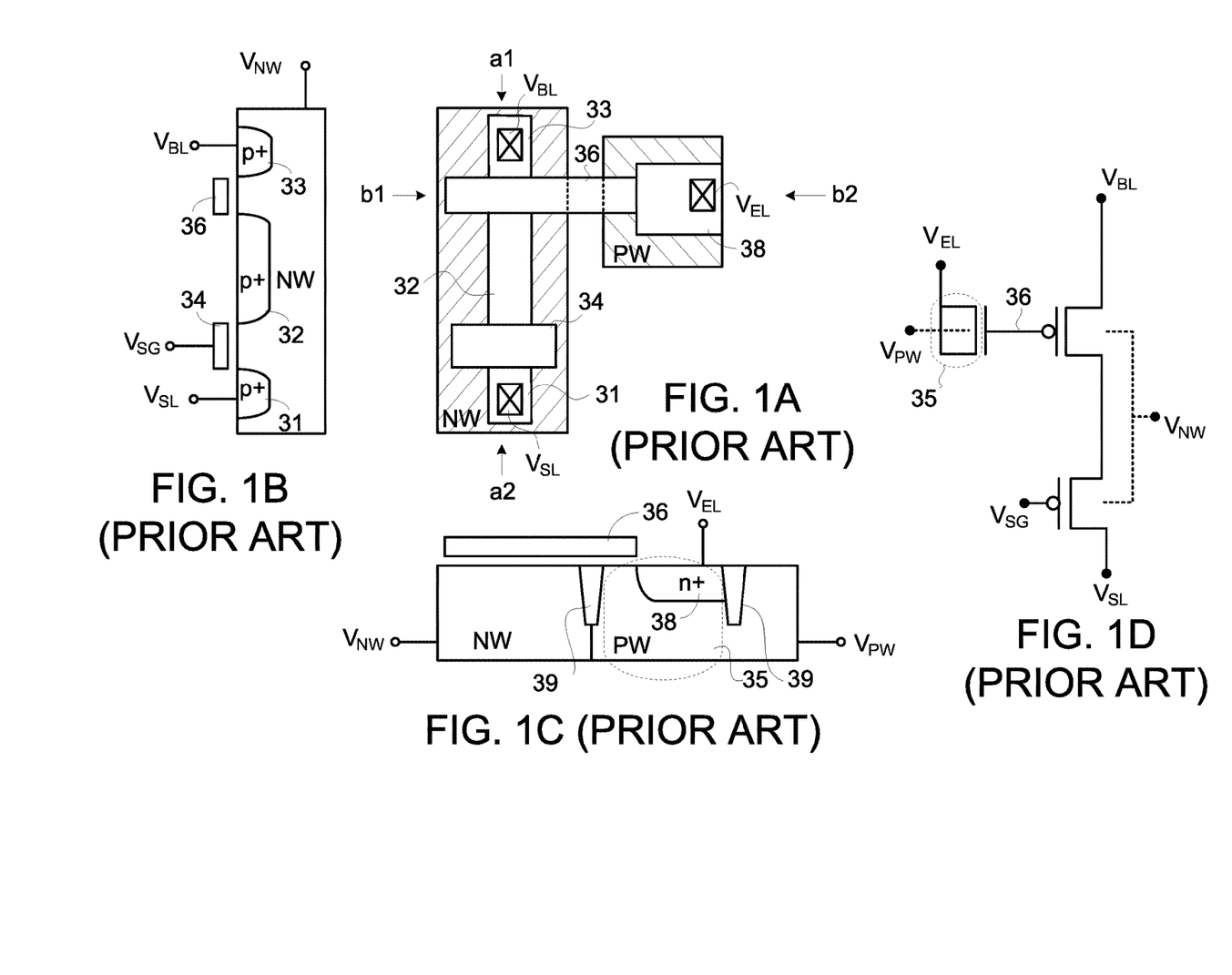
FIGS. 1A~1D (prior art) schematically illustrate the structure and the equivalent circuit of a conventional erasable programmable non-volatile memory.

FIGS. 1A~1D schematically illustrate the structure and the equivalent circuit of a conventional erasable programmable non-volatile memory. The conventional erasable programmable non-volatile memory is disclosed in U.S. Pat. No. 8,941,167. FIG. 1A is a schematic top view of a conventional erasable programmable non-volatile memory. FIG. 1B is a schematic cross-sectional view illustrating the conventional erasable programmable non-volatile memory of FIG. 1A and taken along a first direction (a1-a2). FIG. 1C is a schematic cross-sectional view illustrating the erasable programmable non-volatile memory of FIG. 1A and taken along a second direction (b1-b2). FIG. 1D is a schematic equivalent circuit diagram of the conventional erasable programmable non-volatile memory.

As shown in FIGS. 1A and 1B, the erasable programmable non-volatile memory comprises two serially-connected p-type transistors. These two p-type transistors are constructed in an n-well region (NW). Three p-type doped regions 31, 32 and 33 are formed in the n-well region (NW). In addition, two polysilicon gates 34 and 36 are spanned over the areas between the three p-type doped regions 31, 32 and 33.

The first p-type transistor is used as a select transistor, and the polysilicon gate 34 (also referred as a select gate) of the first p-type transistor is connected to a select gate voltage $V_{SG}$. The p-type doped region 31 is connected to a source line voltage $V_{SL}$. The p-type doped region 32 is a combination of a p-type doped drain region of the first p-type transistor and a p-type doped region of the second p-type transistor. The second p-type transistor is a floating gate transistor. The polysilicon gate 36 (also referred as a floating gate) is disposed over the second p-type transistor. The p-type doped region 33 is connected to a bit line voltage $V_{BL}$. Moreover, the n-well region (NW) is connected to an n-well voltage $V_{NW}$.

As shown in FIGS. 1A and 10, the erasable programmable non-volatile memory further comprises an n-type transistor. The n-type transistor is composed of the floating gate 36 and an erase gate region 35. The n-type transistor is constructed in a p-well region (PW). An n-type doped region 38 is formed in the p-well region (PW). That is, the erase gate region 35 contains the p-well region (PW) and the n-type doped region 38.

As shown in FIG. 1A, the floating gate 36 is extended externally and located near the erase gate region 35. Consequently, the floating gate 36 is also the gate terminal of the n-type transistor. Moreover, the n-type doped region 38 may be considered as a combination of an n-type doped source region and an n-type doped drain region. The n-type doped region 38 is connected to an erase line voltage $V_{EL}$. In addition, the p-well region (PW) is connected to a p-well voltage $V_{PW}$. As shown in FIG. 1C, the erase gate region 35 and the n-well region (NW) are isolated from each other by a shallow trench isolation (STI) structure 39.

The operating principles of the conventional erasable programmable non-volatile memory will be described as follows.

During a program cycle, proper voltages are provided to the corresponding terminals. In a case that the electrons (e.g. hot carriers) are transmitted through a channel region corresponding to the floating gate transistor, the hot carriers are injected into the floating gate 36 and are stored in the floating gate 36. Consequently, the program action is completed.

During an erase cycle, proper voltages are provided to the corresponding terminals. The electrons stored in the floating gate are removed from the floating gate 36 and discharged out of the nonvolatile memory through the n-type doped region 38. Consequently, after the erased state, no electrons are stored in the floating gate 36.

In a read cycle, proper voltages are provided to the corresponding terminals. Depending on whether the electrons are stored in the floating gate 36, different magnitudes of the read current $I_R$ are acquired. That is, in the read state, the storage state of the nonvolatile memory may be realized according to the read current $I_R$.

As mentioned above, the conventional erasable programmable non-volatile memory has a twin-well structure, thus the overall size of the conventional erasable programmable non-volatile memory is large. During the program cycle, the electrons (e.g hot carriers) are injected into the floating gate 36 and stored into the floating gate 36 according to a channel hot electron injection (CHE) effect.

SUMMARY OF THE INVENTION

The present invention provides an erasable programmable non-volatile memory with a novel structure. The erasable programmable non-volatile memory comprises n-type transistors. Moreover, the erasable programmable non-volatile memory is equipped with a program-assisted metal layer over the floating gate. During the program cycle, a bias voltage is provided to the program-assisted metal layer. Consequently, the number of electrons (e.g. hot carriers) to be injected into the floating gate is increased, and the programming capability is effectively enhanced.

An embodiment of the present invention provides an erasable programmable non-volatile memory. The erasable programmable non-volatile memory includes a first transistor, a second transistor, an erase gate region and a metal layer. The first transistor includes a select gate, a first doped region and a second doped region. The select gate is connected with a word line. The first doped region is connected with a source line. The second transistor includes the second doped region, a third doped region and a floating gate. The third doped region is connected with a bit line. The erase gate region is connected with an erase line. The floating gate is extended over and located near the erase gate region. The metal layer is disposed over the floating gate and connected with the bit line.

Another embodiment of the present invention provides an erasable programmable non-volatile memory. The erasable programmable non-volatile memory includes a select transistor, a floating gate transistor, a first capacitor and a second capacitor. A gate terminal of the select transistor is connected with a word line. A first drain/source terminal of the select transistor is connected with a source line. A first drain/source terminal of the floating gate transistor is connected with a second drain/source terminal of the select transistor. A second drain/source terminal of the floating gate transistor is connected with a bit line, wherein the floating gate transistor comprises a floating gate. The first capacitor is connected between the floating gate and an erase line. The second capacitor is connected between the floating gate and the bit line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2A:
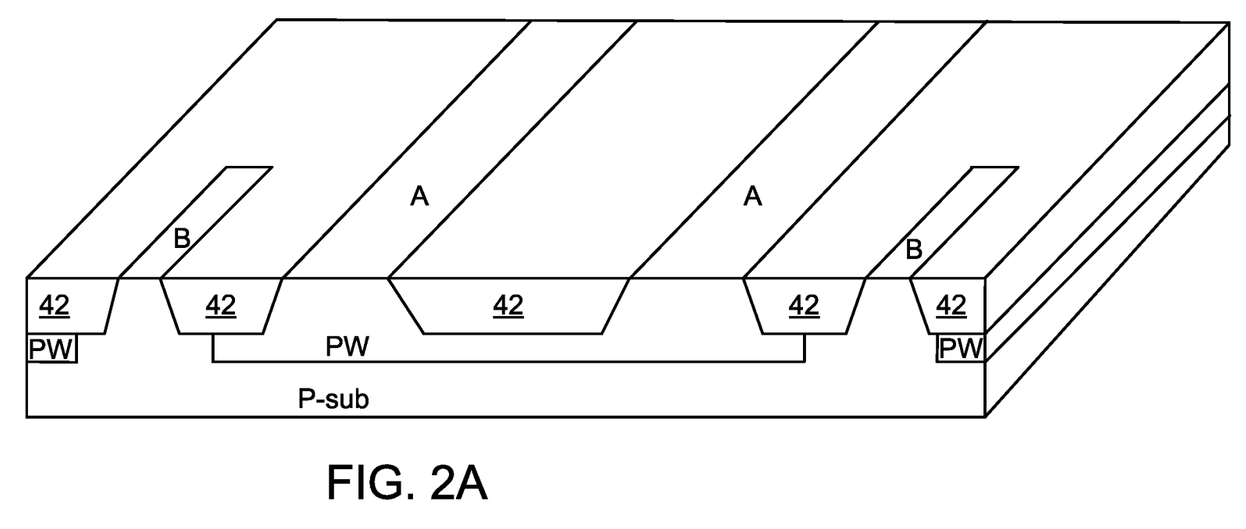
FIGS. 2A~2F schematically illustrate a process of manufacturing an erasable programmable non-volatile memory according to a first embodiment of the present invention.
Figure 2B:
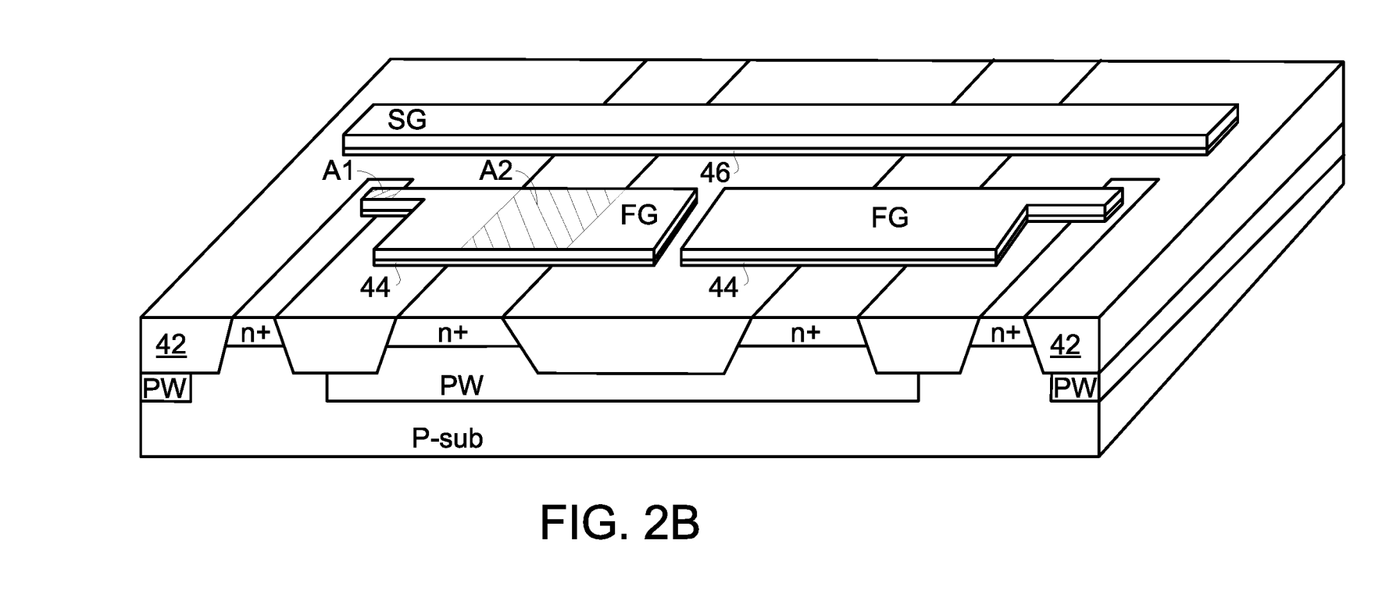
Figure 2C:
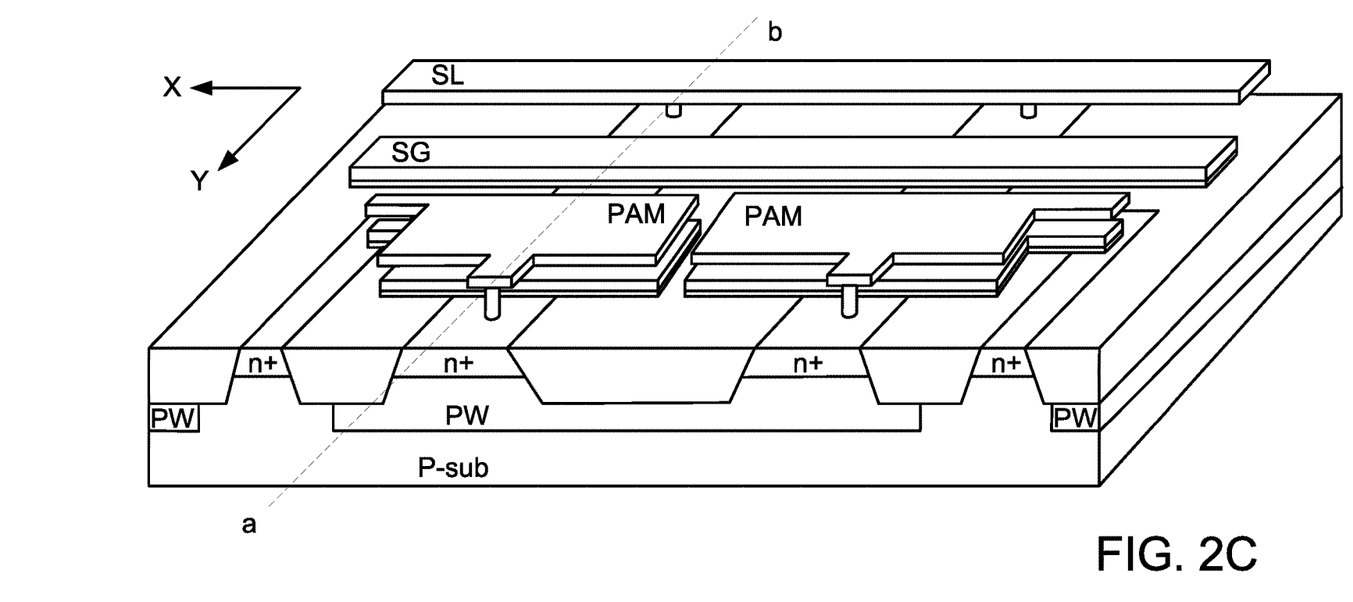
Figure 2D:
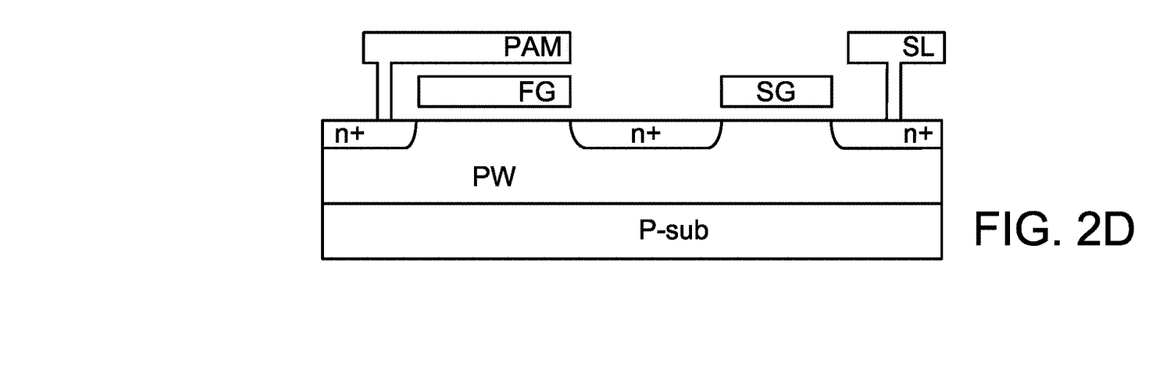
Figures 2E, 2F:
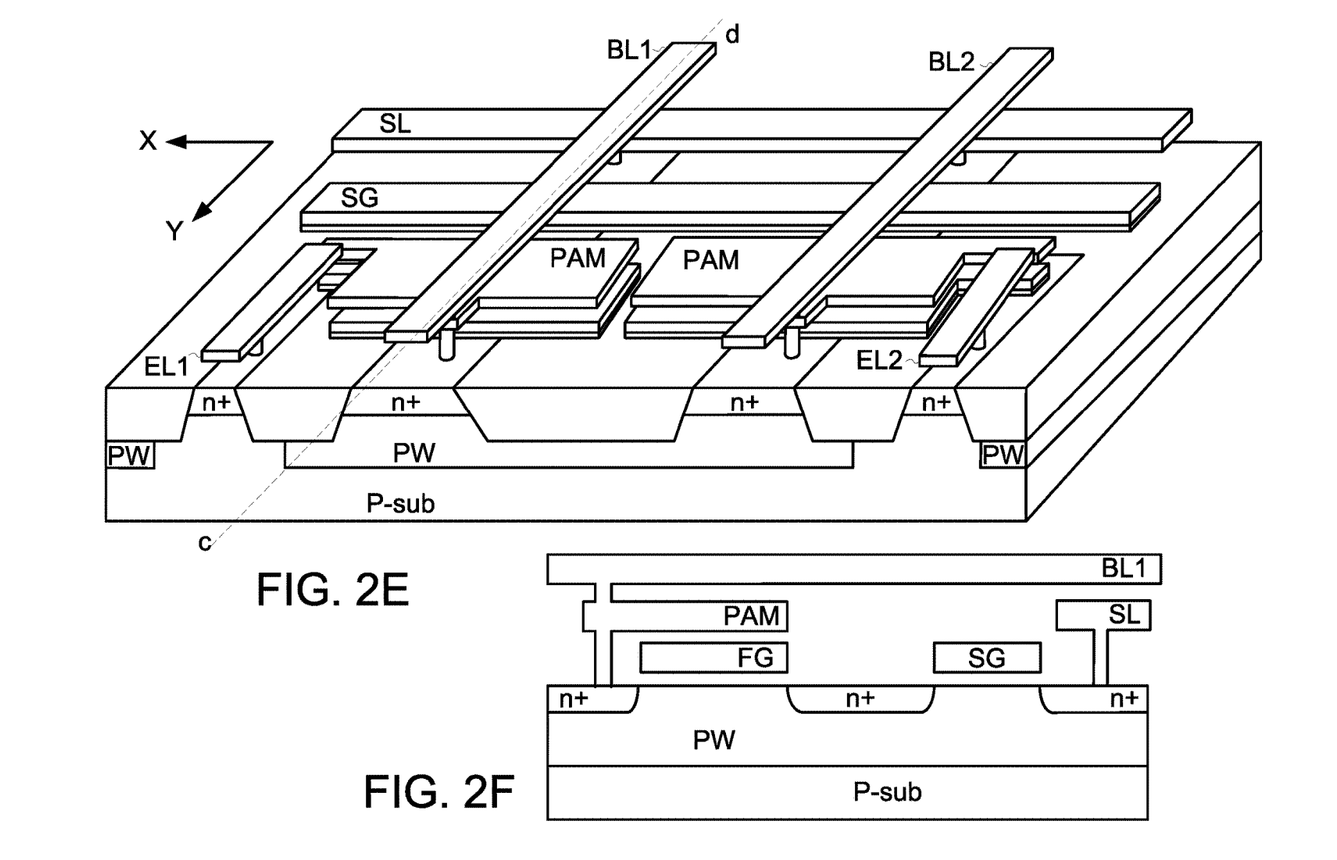
Figure 2G:
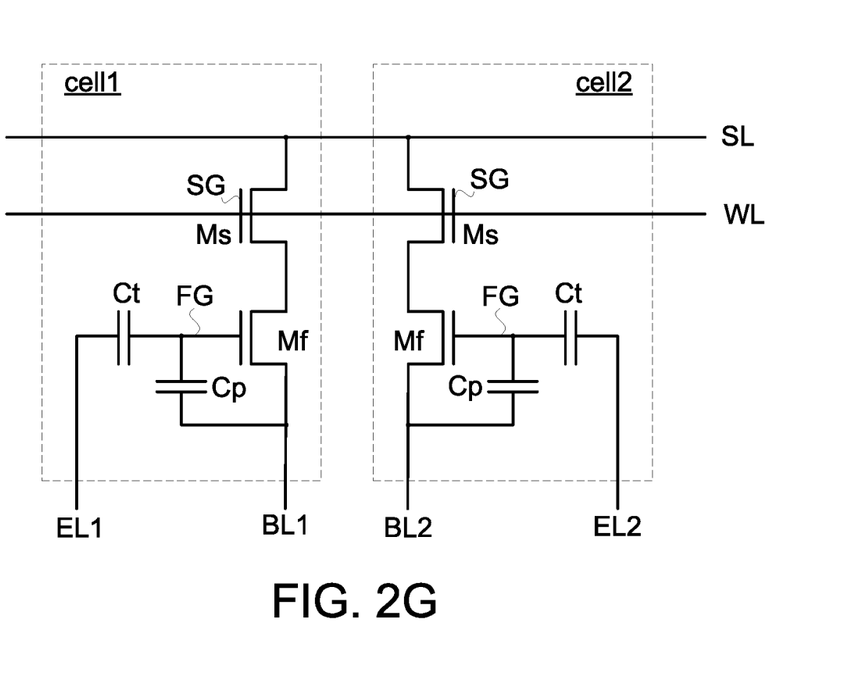
FIG. 2G schematically illustrates an equivalent circuit of the erasable programmable non-volatile memory according to the first embodiment of the present invention.
Figure 2H:
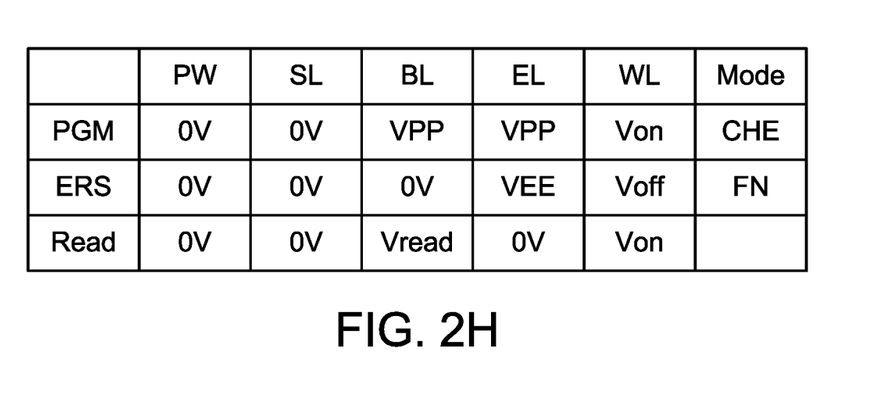
FIG. 2H schematically illustrates associated voltage signals for performing various actions on the erasable programmable non-volatile memory according to the first embodiment of the present invention.

Please refer to FIGS. 2A~2H. FIGS. 2A~2F schematically illustrate a process of manufacturing an erasable programmable non-volatile memory according to a first embodiment of the present invention. FIG. 2G schematically illustrates an equivalent circuit of the erasable programmable non-volatile memory according to the first embodiment of the present invention. FIG. 2H schematically illustrates associated voltage signals for performing various actions on the erasable programmable non-volatile memory according to the first embodiment of the present invention. For succinctness, only two memory cells of the erasable programmable non-volatile memory will be described as follows.

As shown in FIG. 2A, plural isolation structures and a well region are formed. After the isolation structures 42 are formed in a surface of a p-type substrate (p-sub), a first zone A and a second zone B are defined by the isolation structures 42. In an embodiment, the isolation structure 42 is a shallow trench isolation (STI) structure. In the subsequent steps, two serially-connected n-type transistors will be formed in the first zone A and two erase gate regions will be formed in the second zone B. Then, the second zone B is covered, and a p-well region (PW) is formed under the surface of the p-type substrate corresponding to the first zone A.

As shown in FIG. 2B, plural gate structures and plural doped regions are formed. Firstly, two gate oxide layers 44 and 46 are formed on the surface of the p-type substrate. Then, two polysilicon gates FG and SG are formed over the two gate oxide layers 44 and 46, respectively. Consequently, two gate structures are formed.

The first zone A is divided into three sub-zones by the two gate structures. The first gate structure of the two gate structures is extended to the second zone B. The polysilicon gate FG of the first gate structure is a floating gate (FG). The polysilicon gate SG of the second gate structure of the two gate structures is a select gate (SG). Moreover, the select gate is used as a word line.

In the process of forming the doped region in the p-type substrate, the two gate structures are used as the doping masks. Consequently, three n-type doped regions (n+) are formed in the three sub-zones of the first zone A that are not covered by the two gate structures, and a n-type doped region (n+) is formed in the second zone B that is not covered by the first gate structure.

In the first zone, the two n-type doped regions (n+) at bilateral sides of the select gate SG and the select gate SG are collaboratively formed as a select transistor, and the two n-type doped regions (n+) at bilateral sides of the floating gate FG and the floating gate FG are collaboratively formed as a floating gate transistor. The floating gate transistor and the select transistor are n-type transistors that are constructed in the p-well region (PW). Moreover, the floating gate transistor and the select transistor are connected with each other in series.

The n-type doped region (n+) in the second zone B is the erase gate region. The floating gate FG is extended to the erase gate region. Moreover, the erase gate region and the floating gate FG are collaboratively formed as a tunneling capacitor.

As shown in FIG. 2B, a first part A1 of the floating gate FG is disposed over and overlapped with the second zone B, and a second part A2 of the floating gate FG is disposed over and overlapped with the first zone A. Preferably, the ratio of the area of the first part A1 to the area of the second part A2 (i.e., A1/A2) is in the range between ¼ and ⅔. In case that A1/A2 is ⅗, the performance is optimized. Moreover, the second part A2 of the floating gate FG is a channel region of the floating gate transistor.

The process of forming metal layers along a first direction is shown in FIG. 2C. The first direction is the X-axial direction. As shown in FIG. 2C, a source line SL is formed over the surface of the p-type substrate along the first direction. Moreover, the source line SL is connected with the corresponding n-type doped region (n+) of the select transistor through a via.

Moreover, a metal island is formed over the floating gate FG. The metal island is used as a program-assisted metal layer (PAM). The program-assisted metal layer PAM is connected with the corresponding n-type doped region (n+) of the floating gate transistor through a via. Moreover, an Interlayer dielectric (ILD) layer (not shown) is arranged between the program-assisted metal layer PAM and the floating gate FG. That is, the program-assisted metal layer PAM is not in contact with the floating gate FG. The program-assisted metal layer PAM and the floating gate FG are collaboratively formed as a program-assisted capacitor.

In this embodiment, the area of the program-assisted metal layer PAM is larger than area of the floating gate FG. Moreover, the entire of the floating gate FG is covered by the program-assisted metal layer PAM.

FIG. 2D is a schematic cross-sectional view illustrating the structure of FIG. 2C and taken along the line a-b in a second direction. The second direction is the Y-axial direction. As shown in FIG. 2D, the program-assisted metal layer PAM is disposed over the floating gate FG, and the source line SL is connected with the corresponding n-type doped region (n+) of the select transistor through the corresponding via.

The process of forming metal layers along the second direction is shown in FIG. 2E. As shown in FIG. 2E, two bit lines BL1 and BL2 are formed along the second direction. Each of the bit lines BL1 and BL2 is connected with the corresponding program-assisted metal layer PAM through corresponding vias and contacted with the corresponding n-type doped region (n+) of the floating gate transistor.

Moreover, two erase lines EL1 and EL2 are formed along the second direction. Each of the erase lines EL1 and EL2 is connected with the corresponding n-type doped region (n+) of the second zone B through the corresponding via. That is, each of the erase lines EL1 and EL2 is connected with the corresponding the erase gate region.

FIG. 2F is a schematic cross-sectional view illustrating the structure of FIG. 2E and taken along the line c-d in the second direction. As shown in FIG. 2F, the bit line BL1 is connected with the corresponding program-assisted metal layer PAM through corresponding via and contacted with the corresponding n-type doped region (n+) of the floating gate transistor.

It is to be noted that the p-well region (PW) may also extend to encompass the n-type doped region (n+) in the second zone B in another embodiment of the invention. In other words, the floating gate transistor, the select transistor and the erase gate region are all constructed in the p-well region (PW). In this case, the area of the memory cell may be more reduced because the layout of the memory cell constructed in a single type well is not restricted by the foundry well enclosure rule.

The equivalent circuit of the erasable programmable non-volatile memory is shown in FIG. 2G. The erasable programmable non-volatile memory comprises two memory cells cell1 and cell2. Since the memory cells cell1 and cell2 have the same structure, only the memory cell cell1 will be described as follows.

The memory cell cell1 comprises a select transistor Ms, a floating gate transistor Mf, a tunneling capacitor Ct and a program-assisted capacitor Cp. A first drain/source terminal of the select transistor Ms is connected with the source line SL. The select gate SG of the select transistor Ms is connected with the word line WL. A first drain/source terminal of the floating gate transistor Mf is connected with a second drain/source terminal of the select transistor Ms. A second drain/source terminal of the floating gate transistor Mf is connected with the bit line BL1. The tunneling capacitor Ct connected between the erase line EL1 and the floating gate FG of the floating gate transistor Mf. The program-assisted capacitor Cp is connected between the bit line BL1 and the floating gate FG of the floating gate transistor Mf.

The bias voltages applied to the erasable programmable non-volatile memory in a programmed state, an erased state and a read state are listed in the table of FIG. 2H.

In the programmed state (PGM), a ground voltage (0V) is provided to the p-well region PW and the source line SL, a program voltage VPP is provided to the bit line BL and the erase line EL, and an on voltage Von is provided to the word line WL. In an embodiment, the program voltage VPP is about 7.5V, and the on voltage Von is about 1V.

When the select transistor Ms is turned on, a program current is generated by the memory cell. The program current flows in the direction from the bit line BL to the source line SL through the floating gate transistor Mf and the select transistor Ms. As mentioned above, the program voltage VPP is provided to the bit line BL and the erase line EL. When the electrons (e.g., hot carriers) flow through the channel region of the floating gate transistor Mf, the hot carriers are injected into the floating gate FG and stored into the floating gate FG according to the CHE effect. Consequently, the program action of the memory cell is completed.

In the erased state (ERS), the ground voltage (0V) is provided to the p-well region PW, the source line SL and the bit line BL, an erase voltage VEE is provided to the erase line EL, and an off voltage Voff is provided to the word line WL. In an embodiment, the erase voltage VEE is about 12V, and the off voltage Voff is about 0V.

Consequently, the select transistor Ms is turned off. According to a Fowler-Nordheim tunneling effect (abbreviated as FN tunneling effect), the electrons in the floating gate FG are ejected from the floating gate FG. Moreover, the electrons are transmitted to the erase line EL through the tunneling capacitor Ct and ejected out of the erasable programmable non-volatile memory through the erase line EL. Consequently, in the erased state, no electrons are stored in the floating gate FG.

In a read state, the ground voltage (0V) is provided to the p-well region PW, the source line SL and the erase line EL, a read voltage Vread is provided to the bit line BL, and an on voltage Von is provided to the word line WL. In an embodiment, the read voltage Vread is about 1V.

When the select transistor Ms is turned on, a read current is generated by the memory cell. The read current flows in the direction from the bit line BL to the source line SL through the floating gate transistor Mf and the select transistor Ms. The storage state of the erasable programmable non-volatile memory can be realized according to the magnitude of the read current.

Figure 3:
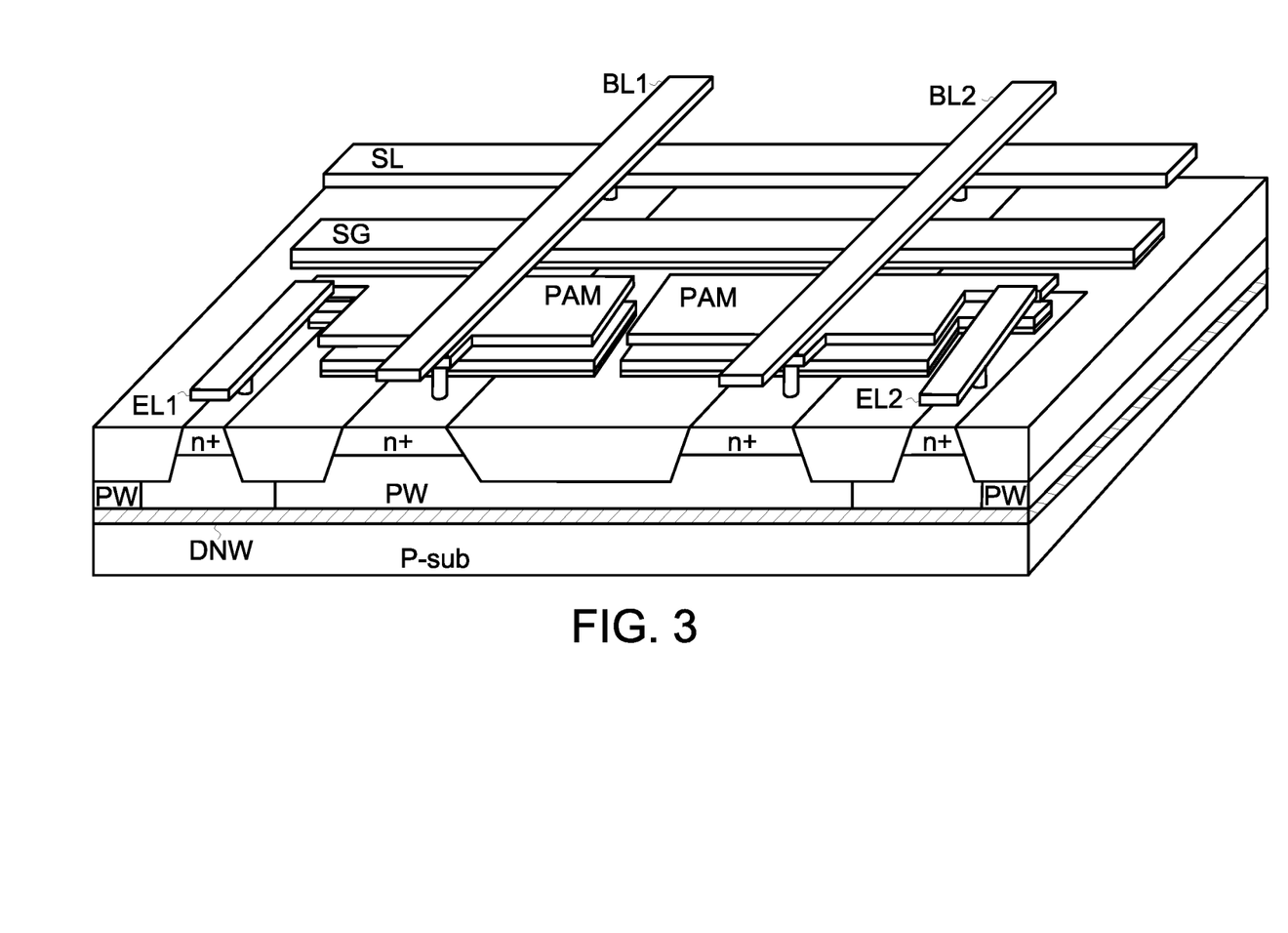
FIG. 3 is a schematic perspective view illustrating an erasable programmable non-volatile memory according to a second embodiment of the present invention.

FIG. 3 is a schematic perspective view illustrating an erasable programmable non-volatile memory according to a second embodiment of the present invention. In comparison with the structure of FIG. 2E, the erasable programmable non-volatile memory of this embodiment further comprises a deep n-well region (DNW). Consequently, the structure of the erasable programmable non-volatile memory of this embodiment is not redundantly described herein. In this embodiment, the select transistor and the floating gate transistor are constructed in the p-well region PW. Moreover, the deep n-well region DNW is arranged between the p-well region PW and the p-type substrate (p-sub).

It is to be noted that the p-well region (PW) may also extend to encompass the n-type doped region (n+) in the second zone B in another embodiment of the invention. In other words, the floating gate transistor, the select transistor and the erase gate region are all constructed in the p-well region (PW). In this case, the area of the memory cell may be more reduced because the layout of the memory cell constructed in a single type well is not restricted by the foundry well enclosure rule.

From the above descriptions, the present invention provides an erasable programmable non-volatile memory with a novel structure. The select transistor and the floating gate transistor of the memory cell are n-type transistors. The memory cell comprising n type transistors has better margin than the memory cell comprising p type transistors due to that the n type transistors has higher mobility than the p type transistors. Moreover, the memory cell is equipped with a program-assisted metal layer. The program-assisted metal layer and the floating gate are collaboratively formed as a program-assisted capacitor. During the program cycle, a bias voltage is provided to the program-assisted metal layer. Consequently, the number of electrons (e.g. hot carriers) to be injected into the floating gate is increased, and the programming capability is effectively enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erasable programmable non-volatile memory, comprising:
    a first transistor comprising a select gate, a first doped region and a second doped region, wherein the select gate is connected with a word line, and the first doped region is connected with a source line;
    a second transistor comprising the second doped region, a third doped region and a floating gate, wherein the third doped region is connected with a bit line, the first transistor and the second transistor are n-type transistors, and the first doped region, the second doped region and the third doped region are n-type doped regions;
    an erase gate region connected with an erase line, wherein the floating gate is extended over and located near the erase gate region; and
    a metal layer disposed over the floating gate and connected with the bit line;
    wherein the first transistor and the second transistor are constructed in a p-well region, and the erasable programmable non-volatile memory further comprises a deep n-well region between the p-well region and a p-type substrate.

2. The erasable programmable non-volatile memory as claimed in claim 1, wherein during a program cycle, a first voltage is provided to the p-well region and the source line, a program voltage is provided to the bit line and the erase line, and an on voltage is provided to the word line, so that plural electrons are injected into the floating gate.

3. The erasable programmable non-volatile memory as claimed in claim 1, wherein during an erase cycle, a first voltage is provided to the p-well region, the source line and the bit line, an erase voltage is provided to the erase line, and an off voltage is provided to the word line, so that plural electrons are ejected from the floating gate.

4. The erasable programmable non-volatile memory as claimed in claim 1, wherein during a read cycle, a first voltage is provided to the p-well region, the source line and the erase line, a read voltage is provided to the bit line, and an on voltage is provided to the word line, so that a read current flows to the source line.

5. The erasable programmable non-volatile memory as claimed in claim 1, wherein a first part of the floating gate is disposed over and overlapped with the erase gate region, and a second part of the floating gate is disposed over and overlapped with a channel region of the second transistor, wherein a ratio of an area of the first part to an area of the second part is in a range between ¼ and ⅔.

6. The erasable programmable non-volatile memory as claimed in claim 1, wherein an area of the metal layer is larger than an area of the floating gate.

7. An erasable programmable non-volatile memory, comprising:
    a select transistor, wherein a gate terminal of the select transistor is connected with a word line, and a first drain/source terminal of the select transistor is connected with a source line;
    a floating gate transistor, wherein a first drain/source terminal of the floating gate transistor is connected with a second drain/source terminal of the select transistor, and a second drain/source terminal of the floating gate transistor is connected with a bit line, wherein the floating gate transistor comprises a floating gate;
    a first capacitor connected between the floating gate and an erase line; and
    a second capacitor connected between the floating gate and the bit line.

8. The erasable programmable non-volatile memory as claimed in claim 7, wherein the select transistor and the floating gate transistor are n-type transistors, and the select transistor and the floating gate transistor are constructed in a p-well region.

9. The erasable programmable non-volatile memory as claimed in claim 8, wherein during a program cycle, a first voltage is provided to the p-well region and the source line, a program voltage is provided to the bit line and the erase line, and an on voltage is provided to the word line, so that plural hot carriers are injected into the floating gate.

10. The erasable programmable non-volatile memory as claimed in claim 8, wherein during an erase cycle, a first voltage is provided to the p-well region, the source line and the bit line, an erase voltage is provided to the erase line, and an off voltage is provided to the word line, so that plural electrons are ejected from the floating gate.

11. The erasable programmable non-volatile memory as claimed in claim 8, wherein during a read cycle, a first voltage is provided to the p-well region, the source line and the erase line, a read voltage is provided to the bit line, and an on voltage is provided to the word line, so that a read current flows to the source line.

* * * * *